(12) United States Patent
Kobrin

(10) Patent No.: US 9,069,244 B2
(45) Date of Patent: Jun. 30, 2015

(54) MASK FOR NEAR-FIELD LITHOGRAPHY AND FABRICATION THE SAME

(71) Applicant: Boris Kobrin, Dublin, CA (US)

(72) Inventor: Boris Kobrin, Dublin, CA (US)

(73) Assignee: Rolith, Inc., Pleasanton, CA (US)

( * ) Notice: Subject to any disclaimer, the term of this patent is extended or adjusted under 35 U.S.C. 154(b) by 65 days.

(21) Appl. No.: 13/767,639

(22) Filed: Feb. 14, 2013

(65) Prior Publication Data

US 2013/0224636 A1    Aug. 29, 2013

Related U.S. Application Data

(63) Continuation of application No. PCT/US2011/045197, filed on Jul. 25, 2011.

(60) Provisional application No. 61/402,085, filed on Aug. 23, 2010.

(51) Int. Cl.
| | |
|---|---|
| G03F 7/24 | (2006.01) |
| G03F 1/00 | (2012.01) |
| G03F 7/00 | (2006.01) |
| G03F 1/92 | (2012.01) |
| B82Y 10/00 | (2011.01) |
| B82Y 40/00 | (2011.01) |

(52) U.S. Cl.
CPC .............. *G03F 1/00* (2013.01); *G03F 7/0002* (2013.01); *G03F 1/92* (2013.01); *G03F 7/24* (2013.01); *B82Y 10/00* (2013.01); *B82Y 40/00* (2013.01)

(58) Field of Classification Search
USPC .......................... 430/5, 322, 323, 394; 355/53
See application file for complete search history.

(56) References Cited

U.S. PATENT DOCUMENTS

| | | |
|---|---|---|
| 4,888,266 A | 12/1989 | Lacotte et al. |
| 5,147,763 A | 9/1992 | Kamitakahara |
| 5,298,366 A | 3/1994 | Iwasaki et al. |

(Continued)

FOREIGN PATENT DOCUMENTS

| | | |
|---|---|---|
| AU | 2005213499 | 8/2005 |
| CA | 2558623 | 8/2005 |

(Continued)

OTHER PUBLICATIONS

European Extended Search Report for EP Application No. 11820330, dated Jun. 14, 2014.

(Continued)

*Primary Examiner* — Stephen Rosasco
(74) *Attorney, Agent, or Firm* — Joshua D. Isenberg; JDI Patent

(57) ABSTRACT

Methods for fabricating nanopatterned cylindrical photomasks are disclosed. A master pattern having nanometer scale features may be formed on a master substrate. A layer of an elastomer material may be formed on a surface of a transparent cylinder. The master pattern may be transferred from the master to the layer of elastomer material on the surface of the transparent cylinder. Alternatively, a nanopatterned cylindrical photomask may be fabricated by forming a pattern having nanometer scale features on an elastomer substrate and laminating the patterned elastomer substrate to a surface of a cylinder. In another method, a layer of elastomer material may be formed on a surface of a transparent cylinder and a pattern having nanometer scale features may be formed on the elastomer material by a direct patterning process.

22 Claims, 12 Drawing Sheets

(56) References Cited

U.S. PATENT DOCUMENTS

| | | | |
|---|---|---|---|
| 5,512,131 | A | 4/1996 | Kumar |
| 5,725,788 | A | 3/1998 | Maracas et al. |
| 5,925,259 | A | 7/1999 | Biebuyck et al. |
| 5,928,815 | A | 7/1999 | Martin |
| 6,045,980 | A | 4/2000 | Edelkind et al. |
| 6,060,143 | A | 5/2000 | Tompkin et al. |
| 6,274,294 | B1 | 8/2001 | Hines |
| 6,344,087 | B2 | 2/2002 | Hein |
| 6,444,254 | B1 | 9/2002 | Chilkoti et al. |
| 6,518,168 | B1 | 2/2003 | Clem et al. |
| 6,753,131 | B1 | 6/2004 | Rogers et al. |
| 6,770,416 | B2 | 8/2004 | Figov |
| 6,808,646 | B1 | 10/2004 | Jeans |
| 7,144,539 | B2 | 12/2006 | Olsson |
| 7,170,666 | B2 | 1/2007 | Piehl et al. |
| 7,208,788 | B2 | 4/2007 | Hiroshima |
| 7,312,939 | B2 | 12/2007 | Bandic |
| 7,431,858 | B2 | 10/2008 | Spiess |
| 7,476,523 | B2 | 1/2009 | Schueller et al. |
| 7,567,774 | B2 | 7/2009 | Yanagihara |
| 7,580,111 | B2 | 8/2009 | Miyamatsu et al. |
| 7,601,394 | B2 | 10/2009 | Gorman et al. |
| 7,654,815 | B2 | 2/2010 | Hasegawa |
| 7,682,540 | B2 | 3/2010 | Boyan et al. |
| 7,875,313 | B2 | 1/2011 | Blanchet et al. |
| 7,922,960 | B2 | 4/2011 | Hiroshima |
| 8,029,717 | B2 | 10/2011 | Nakamura et al. |
| 8,182,982 | B2 | 5/2012 | Kobrin |
| 8,192,920 | B2 | 6/2012 | Kobrin |
| 8,334,217 | B2 | 12/2012 | Kobrin |
| 8,435,373 | B2 * | 5/2013 | Slafer .................. 156/209 |
| 2003/0129385 | A1 | 7/2003 | Hojo et al. |
| 2003/0129545 | A1 | 7/2003 | Kik |
| 2004/0163758 | A1 | 8/2004 | Kagan et al. |
| 2004/0219246 | A1 | 11/2004 | Jeans |
| 2004/0224256 | A1 | 11/2004 | Figov |
| 2004/0257629 | A1 | 12/2004 | Noehte et al. |
| 2005/0048411 | A1 | 3/2005 | Leggett |
| 2005/0196452 | A1 | 9/2005 | Boyan |
| 2005/0202185 | A1 | 9/2005 | Greengarde et al. |
| 2005/0224452 | A1 | 10/2005 | Spiess et al. |
| 2006/0014108 | A1 | 1/2006 | Ito et al. |
| 2006/0072295 | A1 | 4/2006 | Gotzen |
| 2007/0119048 | A1 | 5/2007 | Li et al. |
| 2007/0138699 | A1 | 6/2007 | Wuister et al. |
| 2007/0172746 | A1 | 7/2007 | Hiroshima et al. |
| 2007/0182821 | A1 | 8/2007 | Adamo et al. |
| 2007/0200276 | A1 | 8/2007 | Mackey et al. |
| 2008/0056768 | A1 | 3/2008 | Yanagihara |
| 2008/0229950 | A1 | 9/2008 | Mei et al. |
| 2009/0136679 | A1 | 5/2009 | Boukaftane et al. |
| 2009/0170014 | A1 | 7/2009 | Shibazaki |
| 2009/0269705 | A1 | 10/2009 | Kobrin |
| 2009/0297989 | A1 | 12/2009 | Kobrin |
| 2009/0305513 | A1 | 12/2009 | Kobrin |
| 2010/0018421 | A1 | 1/2010 | Pan et al. |
| 2010/0035163 | A1 | 2/2010 | Kobrin |
| 2010/0109203 | A1 | 5/2010 | Chen et al. |
| 2010/0123885 | A1 | 5/2010 | Kobrin |
| 2010/0173494 | A1 | 7/2010 | Kobrin |
| 2011/0024950 | A1 | 2/2011 | Kruglick |
| 2011/0210480 | A1 | 9/2011 | Kobrin |
| 2012/0162629 | A1 | 6/2012 | Kobrin |
| 2012/0224159 | A1 | 9/2012 | Kobrin |
| 2012/0274004 | A1 | 11/2012 | Kobrin |
| 2012/0282554 | A1 | 11/2012 | Kobrin et al. |

FOREIGN PATENT DOCUMENTS

| | | |
|---|---|---|
| CN | 1735965 | 2/2006 |
| CN | 1943013 | 4/2007 |
| DE | 10233399 | 2/2003 |
| EP | 1331516 A | 7/2003 |
| EP | 1786485 | 5/2007 |
| FR | 2922330 A | 4/2009 |
| GB | 2395799 | 6/2004 |
| JP | 59200419 | 11/1984 |
| JP | 3043185 | 2/1991 |
| JP | 04077746 | 3/1992 |
| JP | 8288195 | 11/1996 |
| JP | 2001220159 | 1/2001 |
| JP | 2002072497 | 3/2002 |
| JP | 2004125913 A | 4/2004 |
| JP | 2005043777 | 2/2005 |
| JP | 2005085965 A | 3/2005 |
| JP | 2005527110 | 9/2005 |
| JP | 2005328020 | 11/2005 |
| JP | 2005331893 A | 12/2005 |
| JP | 2006073784 | 3/2006 |
| JP | 2006269936 | 10/2006 |
| JP | 2006287012 | 10/2006 |
| JP | 2006315033 | 11/2006 |
| JP | 2007076358 A | 3/2007 |
| JP | 2007-203576 A | 8/2007 |
| JP | 2007335647 A | 12/2007 |
| JP | 2008021869 | 1/2008 |
| JP | 2008126370 | 6/2008 |
| JP | 2008290330 A | 12/2008 |
| JP | 2009010188 | 1/2009 |
| JP | 2009078521 | 4/2009 |
| KR | 20090108941 A | 1/2009 |
| KR | 1020090108941 A | 5/2011 |
| WO | 0046641 | 8/2000 |
| WO | 03001869 | 1/2003 |
| WO | 03012549 | 2/2003 |
| WO | 2005077013 | 8/2005 |
| WO | 2008062634 | 5/2008 |
| WO | 2009050141 A | 4/2009 |
| WO | 2009094009 A | 7/2009 |
| WO | 2011087896 A | 7/2011 |

OTHER PUBLICATIONS

Japanese Office Action for JP Application No. 2013-525922, dated Jun. 17, 2014.

Russian Office Action Application No. 2013112860, dated Jun. 10, 2014.

Abel Thanfawng et al, Bond-detach lithographyL amethod for micro/nanolithography by precision PDMS patterning, Small 2007, 3, No. 1, 132-138.

Ali Asgar Bhagat et al, Photodefinable polydimethylsiloxane (PDMS) for rapid lab-on-a-chip prototyping, Lab Chip, 2007, 7, 1192-1197.

Blaber, M.G.; Plasmon Absorption in Nanospheres: A Comparsion of Sodium, Potassium, Aluminium, Silver and Gold, Elsevier, May 15, 2007, Australia.

Brolo, A.G.; The Development of Surface-Plasmon Sensors Using Arrays of Sub-Wavelength Holes, Proceedings of SPIE, the International Society for Optical Engineering, 2005, USA.

Bruce McLeaod; Thin-Films-Motheye Surfaces Reflect Little Light, Lase Focus World, Display Article, (36357).

Carlos Pina-Hernandes et al, High—throughput and etch-selective nanoimprinting and stamping based on fast-thermal-curing poly(dimethylsiloxane)s, Adv. Mat, 2007, 19, 1222-1227.

Cui, B.; Fabrication of Large Area Nanoprism Arrays and Their Application for Surface Enhanced Raman Spectroscopy, Nanotechnology, vol. 19, No. 14, p. 145302 (6 pages).

D Derkacs; Improved Performance of Amorphous Silicon Solar Cells Via Scattering From Surface Plasmon Polaritons in Nearby Metalic Nanoparticles, Appl.Phys.Lett, 89, 09310.

D. Schaadt; Enhanced Semiconductor Optical Absorption via Surface Plasmon Excitation in Metal Nanoparticles, Appl.Phys.Lett, 86,063106, 2005.

Dae-Guen Choi, Jun-Ho Jeong, Young-Suk Sim, Eung-Sug Lee, Woo-Soo Kim, Byeong-Soo Bae; Fluorinated Organic-Inorganic Hybrid Mold as a New Stamp for Nanoimprint and Soft Lithography, Langmuir 2005 9390-9392.

Diethard Kapp-Schwoerer, Roller-coating application of liquid photoresists, PCMI Journal No. 77, Jun. 2000.

(56) References Cited

OTHER PUBLICATIONS

Ducker, R.E.; One-Step Photochemical Introduction of Nanopatterned Protein-Binding Functionalities to Oligo (Etylene Glycol)-Terminated Self-Assembled Monolayers, Journal of the American Chemical Society, Dec. 5, 2007, V 129, N 48, P14842+, USA.
Guoyong Xie; The Fabrication of Subwavelength Anti-Reflective Nanostructures Using a Bio-Template, Nanotechnology 19(2008) 095605, p. 1-5.
Han et al., "Fabrication of complex nanostructures on various substrates", Appl. Phys. Lett., vol. 91 pp. 123118-1 to 123118-3(Sep. 2007).
Hiroyuki Sugimura, Micropatterning of alkyl- and fluoroalkylsilane self-assembled monolayers using vacuum ultraviolet light, Langmuir, 16, pp. 885-888, 2000.
Hiroyuki Sugimura, Oxygen assists vacuum-UV micropatterning of organic surfaces, http://spie.org/x884.4.xml?pf=true&highlight=x2402.
Hua Tan, Andrew Gilbertson, Stephen Y Chou; Roller Nanoimprint Lithography, J.Vac.Sci. Technol. B 1998 3926-3928.
International Search Report and Written Opinion for PCT/US2011/0145197 dated Apr. 6, 2012.
J Wang; Dewetting of Conducting Polymer Inkjet Droplets of Patterned Surface, Nature Materials, V.3, Mar. 2004, p. 171-176.
J. Schneider, A novel method for the deposition of ultra-uniform resist film for mask making, EMLC 2006, Dresden, Germany, Jan. 23-26, 2006.
J.A. Maria A, S. Jeon A, J. Rogers; Nanopatterning With Comformable Phase Masks, Journal of Photochemistry and Photobiology A: Chemistry 166 (2004) 149-154.
Jay et al., "Preshaping photoresist for refractive microlens fabrication", Opt. Eng. vol. 33(11) pp. 3552-3555 (Nov. 1994).
Jing Zhao; Localized Surface Plasmon Resonance Viosensors, Nanomedicine 2006, 1(2), [219-228.
Joana Maria, Experimental and computational studies of phase shift lithography with binary elastimeric masks, Journal of Vacuum Science and technology, B 24(2), Mar./Apr. 2006.
Joel Henze et al, Mulriscale patterning of plasmonic Metamaterials, Nature Nanotechnology, v. 2, 2007, 549-554.
John Rogers et al, Recent progress in soft lithography, Materials Today, Feb. 2005, 50-56.
Kehagias et al., "Reverse-contact UV nanoimprint lithography for multilayered structure fabrication", Nanotech., vol. 18 pp. 1-4 (Apr. 2007).
Kik, P.G.; Metal Nanoparticle Arrays for Near-Field Optical Lithography, Proceeding of the SPIE—the International Society for Optical Engineering, 2002, vol. 4810, p. 7-13, USA.
Kik, P.G.; Plasmon Priniting—A New Approach to Near-Field Lithography, Nanopatterning 13 From Ultralarge-Scale Integration to Biotechnology (Materials Research Society Symposium Proceedings vol. 705), 2002, p. 101-6, USA.
L Creagh; Inkjet Printed Electronics: Moving to Production, Printed Electronincs USA 2007, Nov. 13-14, San Francisco, CA.
Lee, Hyesog; Sub-Diffraction-Limited Optical Imaging With Superlens and Hyperlens, University of California, Los Angeles, vol. 6809B of Dissertation Abstracts International, p. 6252 (118 pages), ISBN: 978-0-549-23309-1, 2007, USA.
Lin, H.; Localized Surface Plasmon Resonance of Metal Nanodot Nanowire Arrays Studied by Far-Field and Near-Field Optical, National Tsing Hua University, Hsinchu (Taiwan) Department of Materials Science and Engineering, Sep. 5, 2007, Taiwan.
Maltebes et al., "moving roll to roll processing from the lab to manufacturing", powerpoint presentation (2006) 42 pages.
McNab, S.J.; Effects of Mask Materials on Near Field Optical Nanolithography, Nanopatterning Ô From Ultralarge-Scale Integration to Biotechnology (Materials Research Society Symposium Proceedings vol. 705), 2002, p. 107-112, USA.
Michael Berger; Moth Eyes Self-Cleaning Antireflection Nanotechnology Coatings, Nanowork, 2008.
Mihee Kim et al, Advancing decal-transfer lithography with a reusable PDMS-coated nanoscale stamp, J. am. Chem.. soc, 2007, 129, (37), 11304-11305.
Pan, Shanlin; Surface Plasmon Resonance Enhanced Photoluminescence and Applications in Organic Electronics, University of Rochester, vol. 6709B of Dissertations Abstracts International, p. 5095 (186 pages), ISBN: 978-0-542-84717-2, 2006, USA.
Paul Konkola et al, Scanning beam interference lithography, 16th Annual meeting of Amer Society of precision Eng., Nov. 2001.
Paul Roach; Progress in Superhydrophobic Surface Development, Soft Matter, 2008, 4, p. 224-240.
Peter Forbes; Self-Cleaning Materials: Lotus Leaf-Inspired Nanotechnology, Scientific American, Jul. 30, 2008.
R. Kunz, Large area patterning of 50 nm structures on flexible substrates using near-field 193 nm radiation, Journal of Vacuum Science and technology, B 21(1), Jan./Feb. 2003.
Rogers J.A et al. " Printing, molding, and near-® eld photolithographic methods for patterning organic lasers, smart pixels and simple circuits", Synthetic Metals Elsevier Switzerland, vol. 115, No. 1-3, Nov. 1, 2000, pp. 5-11, XP002666846, ISSN: 0379-6779.
S Pillai; Surface Plasmon Enhanced Silicon Solar Cells, J.Appl.Phys, 101, 093105 (2007).
S Price; Addressable, Larege-Area Nanoscale Organix Light-Emitting Diodes, Small, 2007, 3, No. 3, p. 372-374.
Se Hyun Ahn et al, High-speed roll-to-roll nanoimprint lithography on flexible plastic substrates, Adv. Mat, 2008, 20, 2044-2049.
Sefa-Ntiri, B.; Embedded Metal Mask Enhanced Evanescent Near Field Optical Lithograhy, Proceedings of the 32nd International Conference on Micro-and Nano-Engineering, May 10, 2007, United Kingdom.
Sheridan, A.K.; Fabrication and Tuning of Nanoscale Metallic Ring and Split-Ring Arrays, Journal of Vacuum Science & Technology B (Microelectronics and Nanometer Structures), Nov. 2007, vol. 25, No. 6, p. 2628-31, USA.
Shvets, G.; Applications of Surface Plasmon and Phonon Polaritons to Developing Left-Handed Materials and Nano-Lithography, Proceeding of the SPIE Ô the International Society for Optical Engineering, Nov. 3, 2003, vol. 5221, No. 1, p. 124-32, USA.
Srituravanich, W,; Sub-100 NM Lithography Using Ultrashort Wavelength of Surface Plasmons, American Institute of Physics Inc., Dec. 1, 2004, USA.
Stephen Y Chou, Peter R Krauss, Preston J Renstrom; Imprint Lithography With 25-Nanometer Resolution, Science Apr. 5, 1996, vol. 272, No. 5258, p. 85-87.
Andrea Cattoni, Jing Chen, Dominique Decanini, Jian Shi and Anne-Marie Haghiri-Gosnet (2011). Soft UVNanoimprint Lithography: A Versatile Tool for Nanostructuration at the 20nm Scale, Recent Advances inNanofabrication Techniques and Applications, Prof. Bo. Cui (Ed.), ISBN: 978-953-307-602-7, InTech, Availablefrom: http://www.intechopen.com/books/recent-advances-in-nanofabrication-techniques-and applications/softuv-nanoimprint-lithography-a-versatile-tool-for-nanostructuration-at-the-20nm-scale.
Journal of Vacuum Science & Technology B 19, 2806 (2001); doi: 10.1116/1.1420203.
Korean Office Action for KR Application No. 10-2013-7005408, dated Jan. 20, 2014.
Takeda, Y.; Surface Plasmon Resonance of AU Nanoparticles Fabricated by Negative Ion Implantation and Grid Structure Toward Plasmonic Applications, Optical Review, Jul.-Aug. 2006, vol. 13, No. 4, p. 231-4, Japan.
Tapio Makela, Novel imprinting tool for roll to roll manufacturing of submicron structures, TNT2005, Aug. 29-Sep. 2, 2005, Oviedo, Spain.
Teri Odom, Materials screening application of plasmonic crystals, MRS bulletin, v. 35, Jan. 2010, 66-73.
U.S. Appl. No. 61/402,085, entitled "Mask for near-field lithography and fabrication the same" to Boris Kobrin, filed Aug. 23, 2010.
Werayut Srituravanich, Plasmonic Nanolithography, Nanoletters, VA,N6, p. 1085, 2004.
Xiangang Luo; Subwavelength Photolithography Based on Surface-Plasmon Polariton Resonance, Opt. Soc. America, Jul. 12, 2004, Optics Express, vol. 12, No. 14, USA.

(56) References Cited

OTHER PUBLICATIONS

Xiangang Luo; Suface Plasmon Resonant Interference Nanolithography Technique, Applied Physics Letter, Jun. 7, 2004, vol. 84, No. 23, p. 4780-2, USA.

Yang, Yong; Nanolithography in Evanescent Near Field by Using Nano-Filmed Noble Metals Layers, SPIE, Dec. 1, 2007, China.

Yasuhisa Inao, Near-field lithography as prototype nano-fabrication tool, Science Direct, Microelectronic Engineering 84 (2007) pp. 705-710.

Younan Xia, Soft Lithography, Annual Rev. Mater ScL, v.28, p. 153-84, 1998.

Zhaoning Yu; Fabrication of Large Area Subwavelength Antireflection Structures on Si Using Trilayer Resist Nanoimprint Lithgraphy and Liftoff, J.Ca.Sci.Techn B21(6).

Japanese Office Action for JP Application No. 2013-525922, dated Jan. 21, 2014.

Notice of Allowance for KR Application No. 10-2013-7005408, dated Mar. 30, 2015.

* cited by examiner

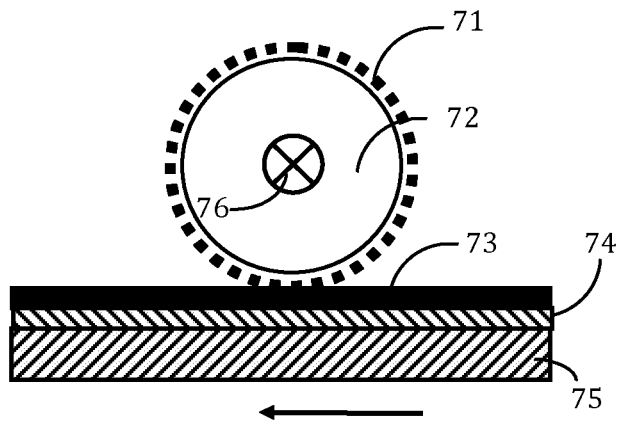
Fig. 7
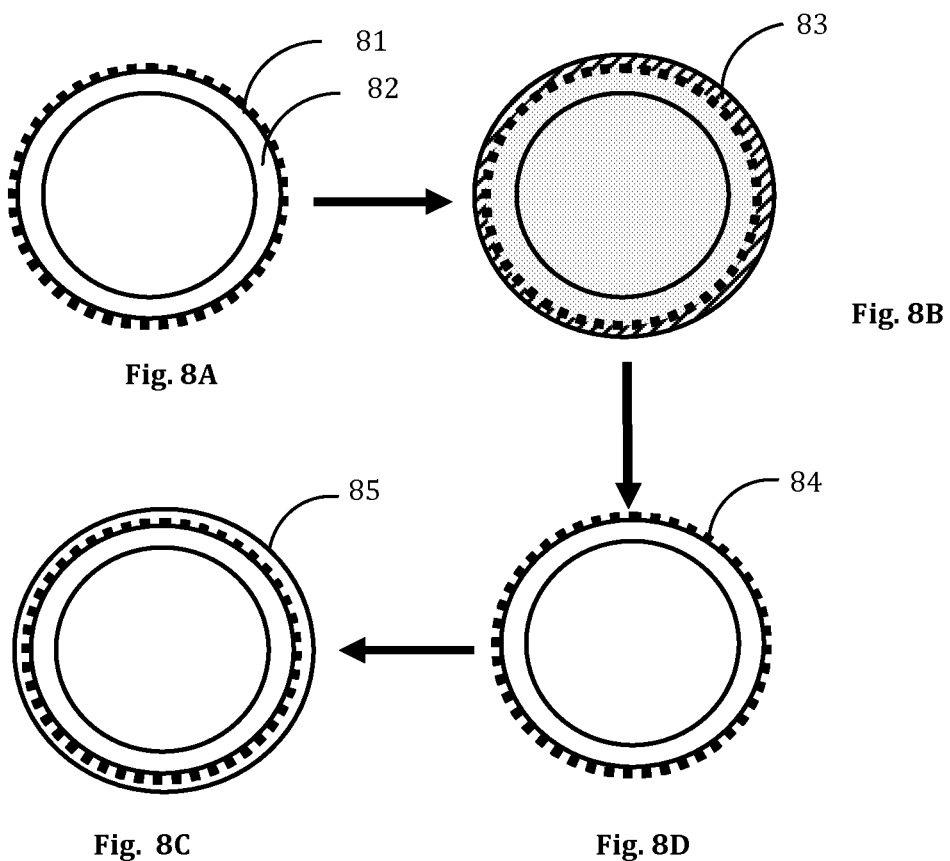
Fig. 8A
Fig. 8B
Fig. 8C
Fig. 8D

MASK FOR NEAR-FIELD LITHOGRAPHY AND FABRICATION THE SAME

CLAIM OF PRIORITY

This application is a continuation of International Application No. PCT/US11/45197, filed Jul. 25, 2011, which claims the benefit of Provisional Application No. 61/402,085, filed Aug. 23, 2010. Both of these prior applications are incorporated by reference in there entirety.

FIELD OF THE INVENTION

Embodiments of the invention relate to methods of manufacturing a near-field optical lithography mask

BACKGROUND

This section describes background subject matter related to the disclosed embodiments of the present invention. There is no intention, either express or implied, that the background art discussed in this section legally constitutes prior art.

Nanostructuring is necessary for many present applications and industries and for new technologies and future advanced products. Improvements in efficiency can be achieved for current applications in areas such as solar cells and LEDs, and in next generation data storage devices, for example and not by way of limitation.

Nanostructured substrates may be fabricated using techniques such as e-beam direct writing, Deep UV lithography, nanosphere lithography, nanoimprint lithography, near-filed phase shift lithography, and plasmonic lithography, for example.

Earlier authors have suggested a method of nanopatterning large areas of rigid and flexible substrate materials based on near-field optical lithography described in Patent applications WO2009094009, and U.S.20090297989, where a rotatable mask is used to image a radiation-sensitive material. Typically the rotatable mask comprises a cylinder or cone. The nanopatterning technique makes use of Near-Field photolithography, where the mask used to pattern the substrate is in contact with the substrate. Near-Field photolithography may make use of an elastomeric phase-shifting mask, or may employ surface plasmon technology, where a rotating cylinder surface comprises metal nano holes or nanoparticles. In one implementation such a mask is a near-field phase-shift mask. Near-field phase shift lithography involves exposure of a photoresist layer to ultraviolet (UV) light that passes through an elastomeric phase mask while the mask is in conformal contact with a photoresist. Bringing an elastomeric phase mask into contact with a thin layer of photoresist causes the photoresist to "wet" the surface of the contact surface of the mask. Passing UV light through the mask while it is in contact with the photoresist exposes the photoresist to the distribution of light intensity that develops at the surface of the mask. A phase mask is formed with a depth of relief that is designed to modulate the phase of the transmitted light by $\pi$ radians. As a result of the phase modulation, a local null in the intensity appears at step edges in the relief pattern formed on the mask. When a positive photoresist is used, exposure through such a mask, followed by development, yields a line of photoresist with a width equal to the characteristic width of the null in intensity. For 365, nm (Near UV) light in combination with a conventional photoresist, the width of the null in intensity is approximately 100 nm. A PDMS mask can be used to form a conformal, atomic scale contact with a layer of photoresist. This contact is established spontaneously upon contact, without applied pressure. Generalized adhesion forces guide this process and provide a simple and convenient method of aligning the mask in angle and position in the direction normal to the photoresist surface, to establish perfect contact. There is no physical gap with respect to the photoresist. PDMS is transparent to UV light with wavelengths greater than 300 nm. Passing light from a mercury lamp (where the main spectral lines are at 355-365 nm) through the PDMS while it is in conformal contact with a layer of photoresist exposes the photoresist to the intensity distribution that forms at the mask.

Another implementation of the mask may include surface plasmon technology in which a metal layer or film is laminated or deposited onto the outer surface of the rotatable mask. The metal layer or film has a specific series of through nanoholes. In another embodiment of surface plasmon technology, a layer of metal nanoparticles is deposited on the transparent rotatable mask's outer surface, to achieve the surface plasmons by enhanced nanopatterning.

The abovementioned application suggests a method of such masks manufacturing from a master (fabricated using one of known nanolithography techniques, like e-beam, Deep UV, Interference and Nanoimprint lithographies), and then creating a replica from the master by molding a polymer material curing the polymer to form a replica film, and finally laminating the replica film onto the surface of a cylinder. Unfortunately, this method unavoidably would create some "macro" stitching lines between pieces of polymer film (even if the master is very big and only one piece of polymer film is required to cover entire cylinder's surface one stitching line is still unavoidable).

The present patent application suggests some new methods of fabricating masks for "rolling mask" lithography equipment.

SUMMARY

Embodiments of the present invention address the problem of manufacturing a near-field optical lithography mask having an optically transparent cylinder with a light source located inside or outside the body and a transparent elastomer film laminated, deposited or otherwise formed on the outer surface of cylinder having a nanostructure on the outer surface of the film.

Embodiments of the present invention pertain to methods useful in fabrication of near-field optical lithography masks for "Rolling mask" lithography. A cylindrical mask is coated with a polymer, which is patterned with desired features in order to obtain a mask for phase-shift lithography or plasmonic printing. The polymer (e.g., an elastomer) may be patterned before or after being disposed on the cylinder surface.

A master for image transfer to a cylinder surface is generated using a known microlithography or nanolithography method (e.g., nanoimprint lithography, energetic beams, UV photolithography, interference lithography, self-assembly, nanoporous materials or natural nanostructured surfaces).

The master can be a flat rigid plate or a flexible film having desired nanometer scale features.

The following methods are suggested for patterning a polymer layer on cylindrical surface: "plate-to-cylinder" nanoimprint lithography, optical lithography in a standard contact or near-field configurations, bond detach or decal transfer lithography, micro-contact printing, nanotransfer printing, and scanning beam interference lithography.

All suggested methods could be implemented in a continuous mode in which the cylinder is continuously rotated during lithography process. Alternatively, all suggested methods could be implemented in a "step-and-rotate" mode in which lithography is done on one section of the cylinder at a time with subsequent rotational step between processes.

BRIEF DESCRIPTION OF THE DRAWINGS

FIG. 7 is a schematic diagram illustrating fabricating a plasmonic near-field mask pattern on a polymer layer formed on cylinder surface in accordance with an embodiment of the present invention.

FIGS. 8A-8D are a sequence of schematic diagrams illustrating an alternative technique for fabricating plasmonic near-field mask pattern on a polymer layer formed on cylinder surface in accordance with an embodiment of the present invention.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," "above", "below", etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
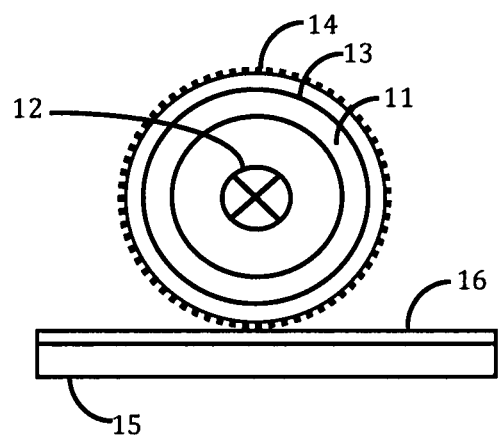
FIG. 1 is a schematic diagram illustrating "Rolling mask" near-field nanolithography.

The authors have described a "Rolling mask" near-field nanolithography system earlier in International Patent Application Publication Number WO2009094009, which is incorporated herein by reference. One of the embodiments is show in FIG. 1. The "rolling mask" consists of glass (quartz) frame in the shape of hollow cylinder 11, which contains a light source 12. An elastomeric film 13 laminated on the outer surface of the cylinder 11 has a nanopattern 14 fabricated in accordance with the desired pattern. The mask is brought into a contact with a substrate 15 coated with photosensitive material 16.

A nanopattern 14 can be designed to implement phase-shift exposure, and in such case is fabricated as an array of nanogrooves, posts or columns, or may contain features of arbitrary shape. Alternatively, nanopattern can be fabricated as an array or pattern of nanometallic islands for plasmonic printing.

Figure 2:
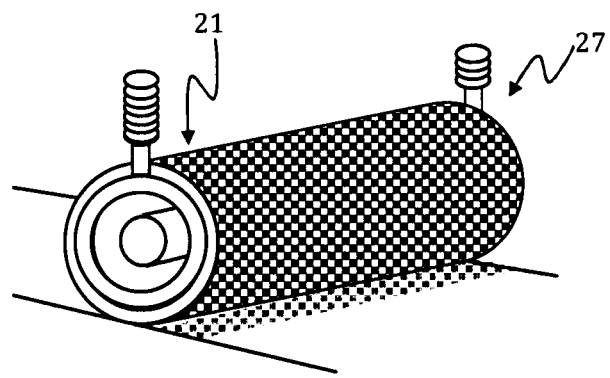
FIG. 2 is a schematic diagram illustrating an opto-mechanical system for rolling mask near-field optical lithography.

The overall view of the opto-mechanical system for rolling mask near-field optical lithography is presented on FIG. 2, where a cylinder 21 is suspended on springs 27.

Figure 3:
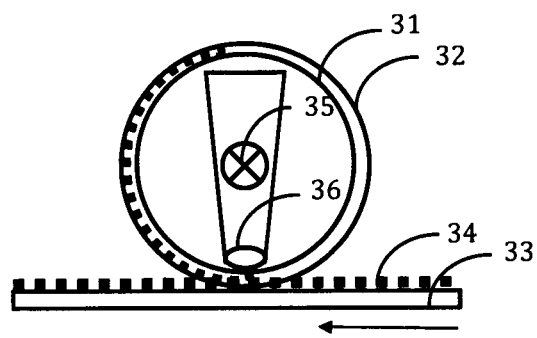
FIG. 3 is a schematic diagram illustrating use of a nanoimprint lithography technique in a "plate-to-cylinder" configuration to pattern a polymer layer formed on cylinder surface in accordance with an embodiment of the present invention.

FIG. 3 represents a first embodiment of the current invention, where a nanoimprint lithography technique in a "plate-to-cylinder" configuration may be used to pattern a polymer layer deposited on cylinder surface. A hollow transparent cylinder 31 is coated with a polymer material 32 using dipping, spraying, roller-coating, knife-edge coating, or other methods. Then the cylinder 31 is contacted with a nanostructured substrate master 33 having a relief profile 34 and the relief profile 34 gets imprinted in the polymer material 32. Imprinted part of the cylinder's surface gets cured thermally or using UV light (for thermally-curable or UV-curable polymer, accordingly). The process can be done in continuous mode by rotating cylinder on the surface of a master or moving a master, which is in contact with rotatable cylinder during imprinting process. Thermal curing of the imprinted stripe of the portion of the cylinder 31 that contacts the master 33 can be done using a heat source 35, such as a heat gun blowing hot gas through an aperture 36. Alternatively, an IR lamp may be used as the heat source 35. The aperture 36 may be configured to isolate the portion of the cylinder 31 that is heated. The heat source 35 can be located inside the cylinder 31 or outside the cylinder from the other side of the master, if the master 33 is made of a transparent material. The aperture 36 may include a cooling means to provide better thermal isolation for the heating zone. UV curing can be done using UV lamps or UV LEDs. Again, an aperture or optical system can be used to focus light on the area of imprinting only. Alternatively, the master 33 can be heated, so that polymer in contact with the master can be cured dynamically. A cooling shield can be implemented to thermally isolate an area of cylinder not in contact with the master 33.

An example of a thermally cured polymer that can be used as the polymer 32 is an elastomer such as Polydimethylsiloxane (PDMS). An example of a UV-curable polymer can be epoxysilicone materials or Polydimethysiloxane-urethane acrylate. The cylinder 31 rotates in sync with translation of the master 33 during this dynamic imprinting process until the surface of cylinder 31 is not patterned completely. Cylinder rotation can be accurately controlled using precision angular encoders to minimize or avoid overlapping of patterns.

Figure 4:
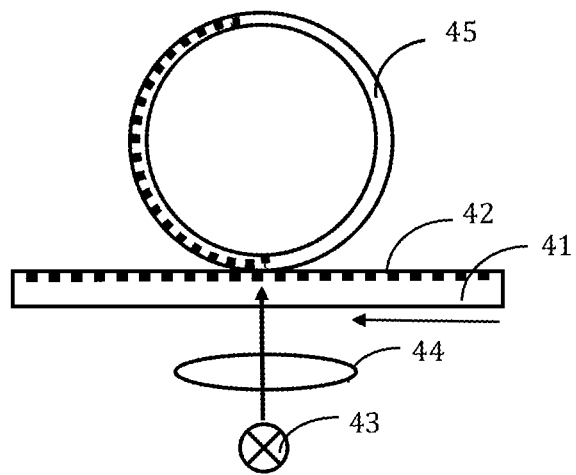
FIG. 4 is a schematic diagram illustrating use of a contact optical lithography technique to pattern a polymer layer formed on cylinder surface in accordance with an embodiment of the present invention.

FIG. 4 shows another embodiment, where contact optical lithography is used to create a pattern using an optical mask 41, which can be a photomask with transparent and opaque features, or phase-shift mask with surface relief, or plasmonic mask, or combination of two or all three types of mask. Light is directed from a light source 43 through the optical system 44 onto a contact area. The speed of rotation is designed to provide desired exposure of the photosensitive polymer 45. The exposure process is followed by polymer development, which dissolves the exposed areas (if polymer is a positive tone), and unexposed areas (in case of negative tone polymer).

Figure 5:
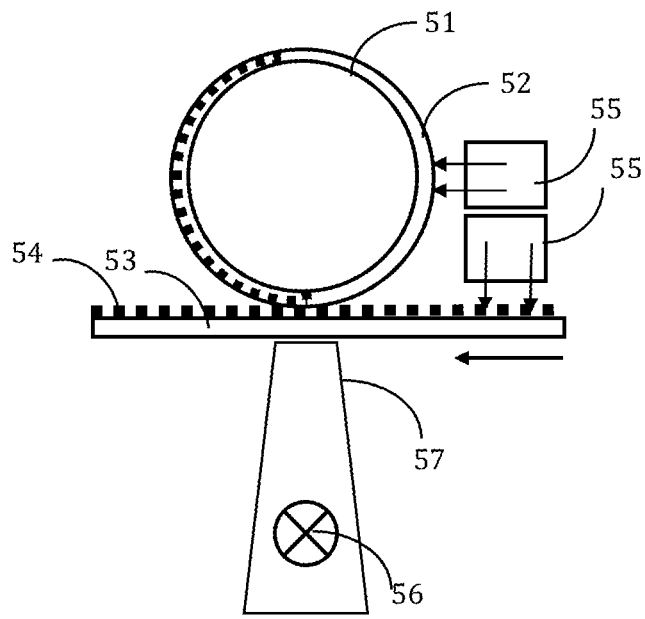
FIG. 5 is a schematic diagram illustrating use of a bond-detach lithography technique to pattern a polymer layer formed on cylinder surface in accordance with an embodiment of the present invention.

FIG. 5 represents another embodiment where so-called bond-detach lithography is used for patterning a polymer 52 deposited on a cylinder 51. The polymer layer 52, for example is made of elastomer material, specifically polydimethylsiloxane (PDMS). The polymer 52 (or a precursor thereof) is deposited on cylinder 51. A substrate 53 made of glass or other suitable material has an oxide layer deposited or grown on it. In one embodiment a pattern 54 is fabricated in a gold layer deposited on glass/oxide. In other embodiments the pattern 54 may be made of Teflon or Parylene layers. Both surfaces, the polymer 52 and an exposed part of the oxide 54 on the substrate 53, are activated by exposure to oxygen or air plasma, or UV Ozone, or Corona discharge 55. Then upon a contact between the activated polymer 52 and activated oxide 54 they bond together with a strong Si—O—Si bond. The strength of this bond can be enhanced by fast temperature curing using a heat source 56, such as a heat gun or an IR lamp though an aperture or shield 57 to provide local heating only in the area of contact. Alternatively the substrate 53 can be heated to promote fast curing of PDMS-oxide bonds upon a contact. Certain activated polymers (e.g., PDMS) cannot create a bond with gold surface. Once the cylinder rotates, oxide on the substrate pulls bonded polymer 52 parts from the cylinder 51, which forms a pattern on the surface of the cylinder 51 complimentary to the gold pattern on the oxide surface.

Figure 6:
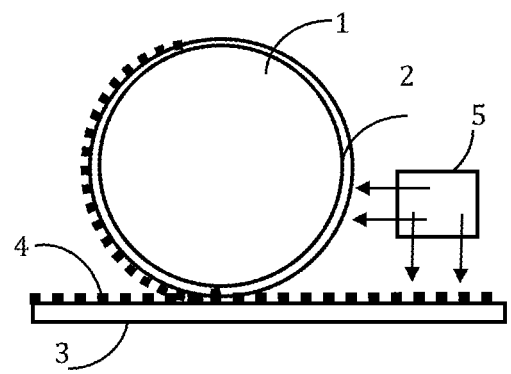
FIG. 6 is a schematic diagram illustrating use of a decal transfer lithography technique to pattern a polymer layer formed on cylinder surface in accordance with an embodiment of the present invention.

In yet embodiment decal transfer lithography may be used to pattern a cylinder. In such an embodiment the master may be made of thin elastomeric layer (for example, PDMS) deposited on a substrate and patterned with a desired features. FIG. 6 shows how both surfaces, a patterned elastomer master 64 and unpatterned elastomer on a cylinder 62 are activated by exposure to an activation source, e.g., UV, Ozone, oxygen or air plasma, or Corona discharge, and brought in contact during rotation of cylinder 62. As a result elastomer features on a master would bond to the elastomer layer on the cylinder 62 and upon cylinder rotation would be transferred from a master onto the cylinder's surface.

In another, more preferred, embodiment the elastomeric master can be reused. In such a case, a rigid master made from glass or Si, or other rigid material is patterned with desired features, then a thin elastomer (e.g., PDMS) layer with a specified thickness is deposited on top of this surface relief. Upon activation with UV Ozone, Oxygen or air plasma, or Corona discharge, and contact with the layer of PDMS on the cylinder surface, PDMS features defined by master profile will be transferred to the cylinder surface. Then master can be stripped from remaining PDMS material and recoated again for the next process.

The next few embodiments describe methods for plasmonic near-field mask fabrication.

In a first embodiment, as shown on FIG. 7, a plasmonic near-field mask is fabricated using one of methods similar to those described above for phase-shift mask fabrication. The near field mask includes a nanopatterned elastomeric layer 71 on a cylinder 72. The plasmonic effect can be achieved by using thin film of metal 73 deposited on a photoresist surface 74 on a substrate 75 that is to be patterned. When UV light from a source 76 passes through the nanopatterned elastomeric layer 71 localized surface plasmons are excited due to the interactions between the incident photons and the free electrons on the surface of metal film 73. The excitation of the plasmons results in a large amount of energy accumulating around the edges of the nanopattern. The elastomeric mask pattern edges provide modulation of optical field in the photoresist, which is used to create a corresponding pattern in the substrate 75.

Alternatively, a thin metal layer can be deposited directly on cylinder surface first, then a thin (e.g., less than 100, nm) elastomer layer can be deposited on top of the metal layer and patterned according to any of the methods described in this invention. The resulting mask can act as plasmonic mask where the elastomeric mask pattern edges provide modulation of optical field in the photoresist, which is used to create a pattern.

In yet another embodiment shown in FIGS. 8A-8D, plasmonic mask fabrication starts with deposition an patterning of a photoresist 81 on a cylinder 82 according to one of the methods described above (for example, nanoimprint or optical lithography), as shown in FIG. 8A. Then, as shown in FIG. 8B, a metal layer is deposited on top of the photoresist pattern, which is followed by a lift-off process (dissolving photoresist), which leaves a metal pattern 84 on the surface of the cylinder 82, as shown in FIG. 8C. Finally, as shown in FIG.

8D, a thin elastomer (e.g., PDMS) layer 85 is deposited on top of the metal pattern 84. The resulting mask can act as plasmonic near-field mask.

Figures 9A, 9B:
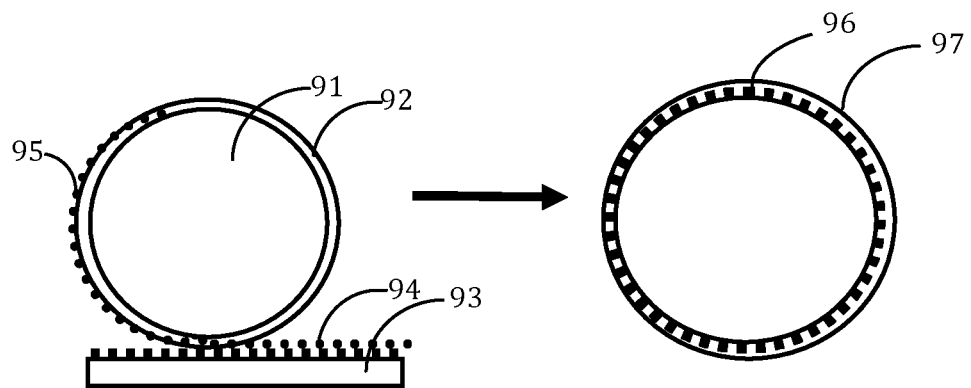
FIGS. 9A-9B are a sequence of schematic diagrams illustrating use of a microcontact printing technique to transfer a metal pattern to a cylinder surface in accordance with an embodiment of the present invention.

Another embodiment uses microcontact printing technique to transfer metal pattern to a cylinder surface. As shown in FIG. 9A, a cylinder 91 is first coated with a thin metal layer 92 (for example, a gold layer), and then is contacted with a patterned substrate (master) 93 having a self-assembled monolayer (SAM) 94 deposited on it. It is preferred for the master 93 to be made of a soft material to assure intimate contact between the surfaces of the master 93 and cylinder 91, thus elastomers (like, PDMS) may be used for this purpose. The SAM 94 can be chosen to have a specific affinity to metal atoms in the metal layer 92 (in the case of gold, the SAM can have exposed thiol groups). Upon contact between the cylinder 91 and master 93 SAM molecules would bond to the metal surface 92 and as the cylinder rotates and detaches SAM molecules from the master 93, such molecules would transfer to the cylinder's surface. This will create a resist mask 95 at metal surface, as shown in FIG. 9B. This resist can be subsequently used as an etch mask for metal etch, which creates a metal nanostructure 96. Finally, this nanostructure is coated with a thin elastomer layer 97 to provide transparent conformal interface between cylinder and a master for slip-free movement.

Figure 10:
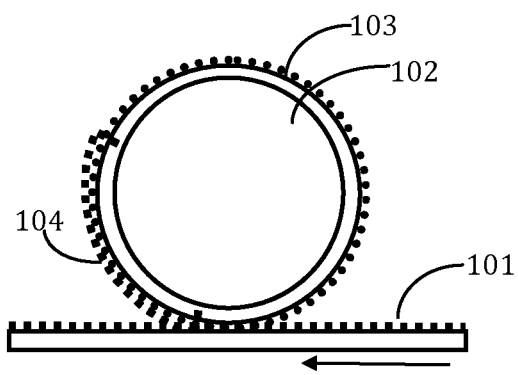
FIG. 10 is a schematic diagram illustrating use of nanotransfer printing to create a metal nanopattern on an elastomer layer formed on a cylinder surface in accordance with an embodiment of the present invention.

Another embodiment uses nanotransfer printing to create a metal nanopattern on a cylinder surface. This process is an inversion of micro-contact printing described above. This time, as shown on FIG. 10, a thin metal layer (for example, gold) is printed from a master pattern 101 made in soft elastomeric material (for example, PDMS) onto a cylinder 102, which is covered with a SAM layer 103 having metal-affinity exposed groups (in case of an affinity to gold, these could be for example, a thiol-terminated SAMs). Covalent bonds between the SAM layer 103 on the cylinder 102 and metal on the master patter 101 form upon contact between master and cylinder. Rotating the cylinder 102 causes failure at the metal-master interface (e.g., gold does not adhere strongly to PDMS) and transfers the metal pattern to the cylinder surface 94.

Finally, in another embodiment for plasmonic masks during preparation of elastomeric material (for example, PDMS), nanometallic particles are mixed with the polymer precursors, a so metal-impregnated elastomer (e.g., metal-impregnated PDMS) is formed, which then is patterned onto the cylinder surface using any of abovementioned methods. The resulting mask can act as plasmonic mask where the elastomeric mask pattern edges provide modulation of optical field in the photoresist, which is used to create a pattern.

Since the cost of fabricating a master with nanosize features is more expensive for larger areas, it is desirable to limit the master surface area. In this case all mentioned embodiments could be implemented in a fashion referred to herein as a "step-and-rotate" mode. In this mode, as shown on FIG. 11, a cylinder 111 with a polymer layer 112 is brought into contact with a narrow stripe 113 of a patterned master 114, then a polymer 112 deposited on the cylinder gets patterned using one of suggested above methods (nanoimprint lithography, photolithography, decal transfer or bond-detach lithography). And finally, cylinder is released from the master, rotated the angle sufficient for positioning and unexposed/un-imprinted/un-printed portion of cylinder over the master surface, and brought in contact with it for patterning again. Cylinder rotation can be controlled accurately using an angular encoder. Such a step-and-rotate process may be repeated until the entire cylinder surface is patterned.

Figure 11:
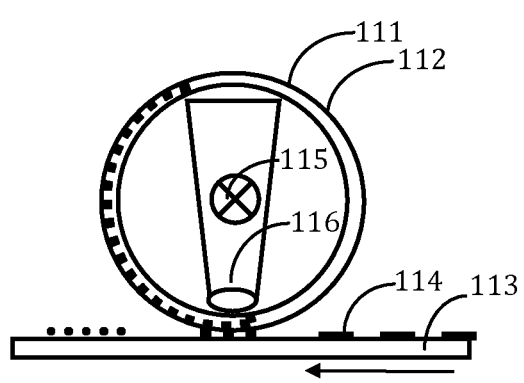
FIG. 11 is a schematic diagram illustrating use of a "step-and-rotate" mode to create a nanopattern on an elastomer layer formed on a cylinder surface in accordance with an embodiment of the present invention.

Another embodiment uses multiple-feature patterns or gradients of different size patterns fabricated on the master, and the substrate can be translated to use one type of pattern or another to imprint/expose cylinder, as shown on FIG. 11.

Figure 12:
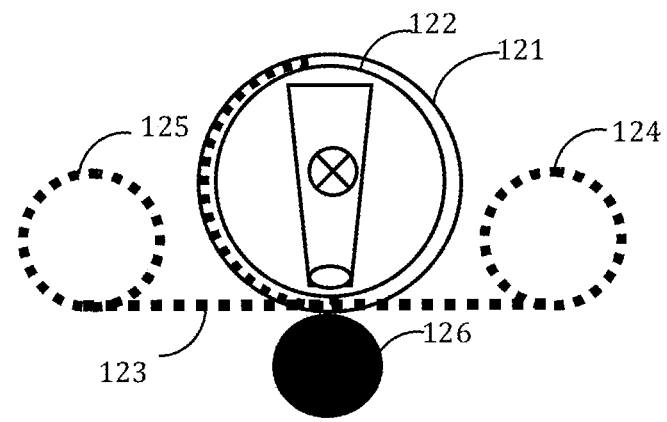
FIG. 12 is a schematic diagram illustrating use of a flexible master to create a nanopattern on an elastomer layer formed on a cylinder surface in accordance with an embodiment of the present invention.

Another embodiment includes any of abovementioned embodiments where, instead of a flat master, a flexible master is used in the form of a nanostructured polymer, metal or flexible film made from other materials. FIG. 12 shows an example of such a system, where a polymer layer 121 on a cylinder 122 is imprinted by a flexible master 123 transported from a first reel 124 to a second reel 125. Another cylinder 126 is used to exert pressure and support the flexible master film. The same flexible master 123 could be a Nanoimprint master or Phase-shift mask with surface relief, or photomask with opaque and transparent areas, or elastomeric film patterned and activated for bond-detach or decal transfer lithography.

Figure 13:
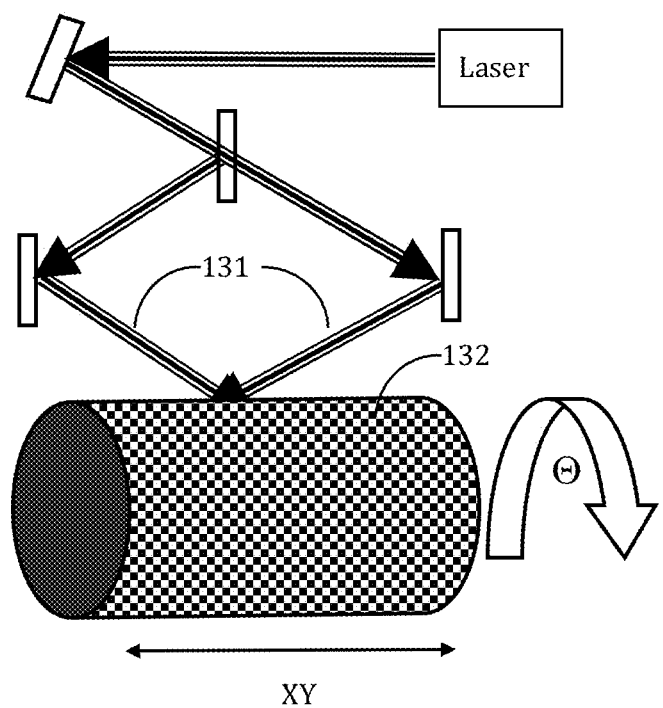
FIG. 13 is a schematic diagram illustrating use of interference lithography to create a nanopattern on an elastomer layer formed on a cylinder surface in accordance with an embodiment of the present invention.

Another embodiment employs interference/holographic lithography to pattern photosensitive layer on deposited on cylinder's surface. FIG. 13 represents a simplified schematic depicting a setup for scanning beam interference lithography (SBIL). A pair of narrow low-distortion laser beams 131 overlap on the surface of photosensitive polymer 132 deposited on surface of cylinder, producing a small grating image. The cylinder is moved under the beams in X-Y directions and rotated writing a grating image over the entire surface of cylinder. The optical system (or cylinder) can then be turned 90, degrees and the process may be repeated again, which can create a checkerboard pattern required to produce an array of posts or holes for many applications.

Figure 14A:
FIGS. 14A-14D are a sequence of schematic diagrams illustrating fabrication of a nanopatterned polymer layer and subsequently attaching the polymer layer to a cylinder in accordance with an embodiment of the present invention.
Figure 14B:
Figure 14C:
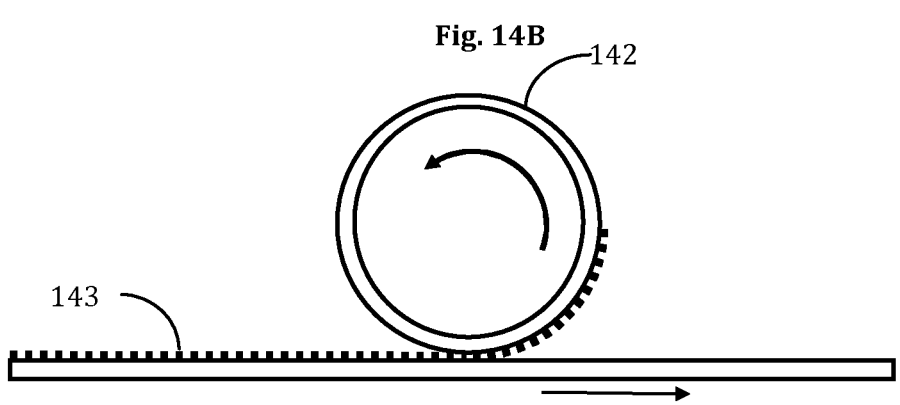
Figure 14D:
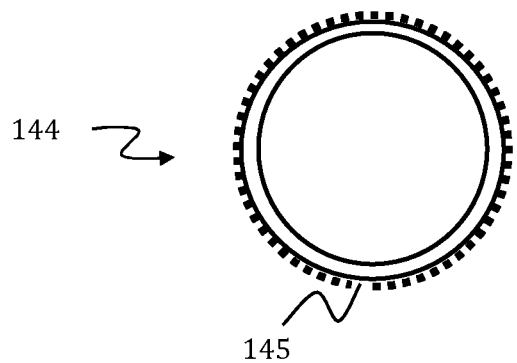

In some embodiments of the present invention, as shown in FIG. 14A, a flat polymer film 141 may be nanopatterned, as shown in FIG. 14B and the resulting nanopatterned polymer film 143 may be attached to the surface of a cylinder 142, as shown in FIG. 14C. The result is a cylindrical mask 144, as shown in FIG. 14D. By way of example, and not by way of limitation, the flat polymer film may be lithographically patterned using a transparent rotating cylinder mask, e.g., as described in commonly-assigned co-pending U.S. patent application Ser. No. 12/384,219, to Boris Kobrin et al., entitled LARGE AREA NANOPATTERNING METHOD AND APPARATUS filed Apr. 1, 2009, which was published as U.S. Patent Application Publication Number 20100123885, on May 20, 2010, the entire contents of both of which are incorporated herein by reference. The elastomer film may be nanostructured using any suitable nanolithography technique. Examples of suitable techniques include, but are not limited to nanoimprint lithography, ultraviolet (UV) lithography, including steppers, e-beam lithography, etc.). After nanopatterning, the film may be attached (e.g., laminated) to the outer surface of a cylinder. The nanopatterned film 143 may be made slightly longer than the circumference of the cylinder 142 so that the film slightly overlaps itself at its ends when attached to the cylinder. Such overlap can avoid or reduce a "seam" 145 in the pattern when the pattern on the film is transferred to a substrate during lithography. Alternatively, a curved master (or submaster) having a radius of curvature equal to that of the cylinder may be used to pattern the seam.

Figure 15A:
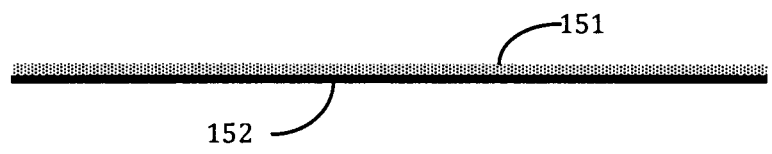
FIGS. 15A-15D are a sequence of schematic diagrams illustrating fabrication of a nanopatterned metal layer on a polymer layer and subsequently attaching the polymer layer to a cylinder in accordance with an embodiment of the present invention.
Figure 15B:
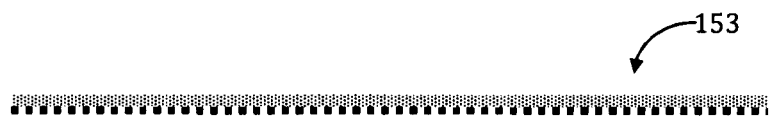
Figure 15C:
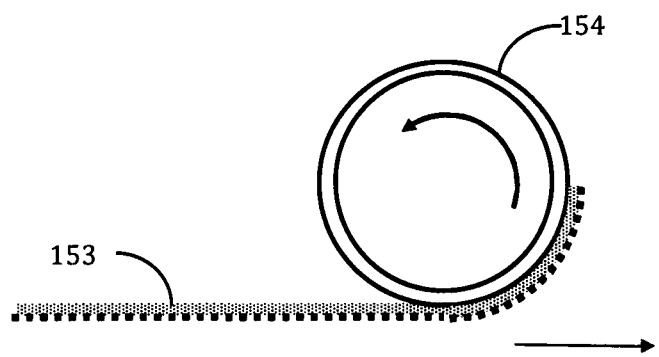
Figure 15D:
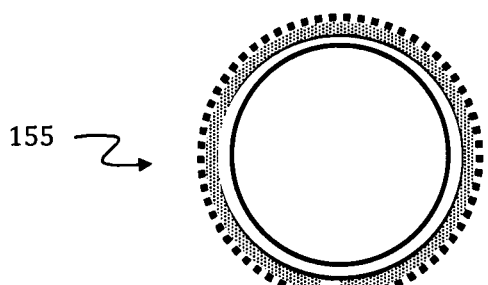

The embodiment shown in FIGS. 14A-14D may be modified for fabrication of plasmonic masks as shown in FIGS. 15A-15D. In embodiments that relate to fabrication plasmonic masks a polymer (e.g., an elastomer) film 151 may be coated with a thin metallic coating 152, as shown in FIG. 15A, and a nanostructure pattern may be formed in the metallic coating 152, as shown in FIG. 15B. The resulting composite nanopatterned film 153 may be attached to the surface of a cylinder 154, as shown in FIG. 15C, e.g., by lamination. The result is a cylindrical plasmonic mask 155, as shown in FIG. 15D.

Figure 16A:
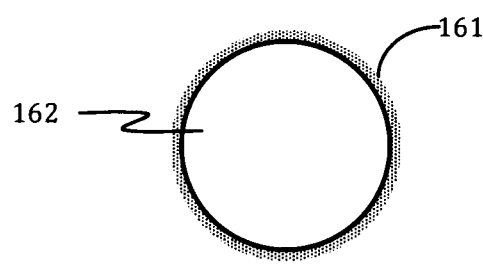
FIGS. 16A-16D are a sequence of schematic diagrams illustrating fabrication of a nanopatterned cylinder mask by transfer of a nanopattern from a flat mask to a polymer layer on the cylinder.
Figure 16B:
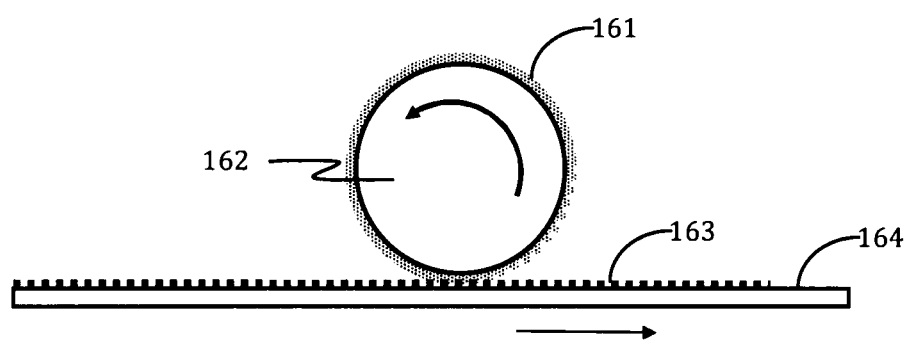
Figure 16C:
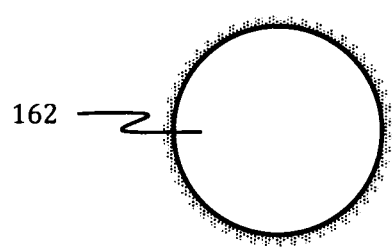
Figure 16D:
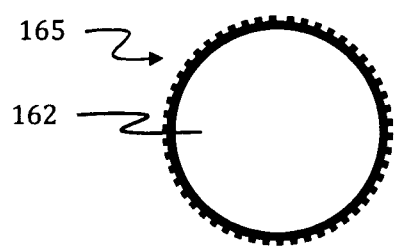

In some embodiments, the nanopatterned film may be fabricated directly on the cylinder. For example, as shown in FIG. 16A, a film 161 of a liquid polymer precursor may be deposited onto an outer surface of a cylinder 162, e.g., by dipping, roller coating or spray-coating. Then a nanopattern 163 can be transferred from a flat master (or submaster) 164 to the film 1601, as shown in FIG. 16B-16C, using a suitable nanoimprint method (e.g., plate-to-cylinder) with thermal or UV curing, or optical lithography, if polymer layer is photosensitive), or bond-detach lithography. Curing the liquid polymer film 161 fixes the nanopattern and completes the cylindrical mask 165, as shown in FIG. 16D.

In some implementations, it may be desirable to partially cure the polymer prior to imprinting nano structure on it (or on a metal layer formed on it). Otherwise it might be tricky to control thickness uniformity of the polymer layer.

Figure 17A:
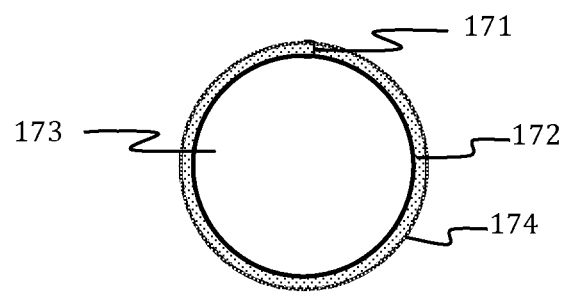
FIGS. 17A-17B are a sequence of schematic diagrams illustrating fabrication of a nanopatterned cylinder mask with a dual layer polymer in accordance with an embodiment of the present invention.
Figure 17B:
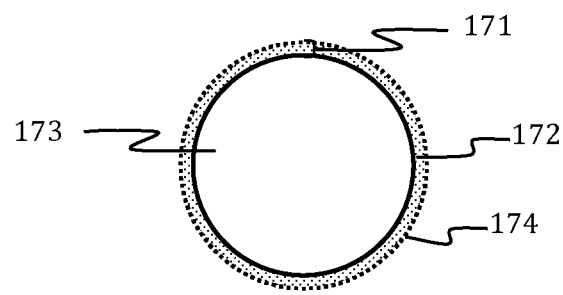

In a variation on embodiments described above, the polymer film can include two or more layers instead of one. For example, as shown in FIG. 17A, a polymer film 171 may include a first layer 172 of elastomer that is relatively thick (e.g., 0.5-5, millimeters thick) that is deposited directly on cylinder 173 as a "soft cushion". A much thinner second layer 174 (e.g., 100-1000, nanometers thick) of polymer having higher modulus than the first layer 171 can be formed on or attached to the first layer, as shown in FIG. 17B, and nanostructured using methods described in this application.

Figure 18A:
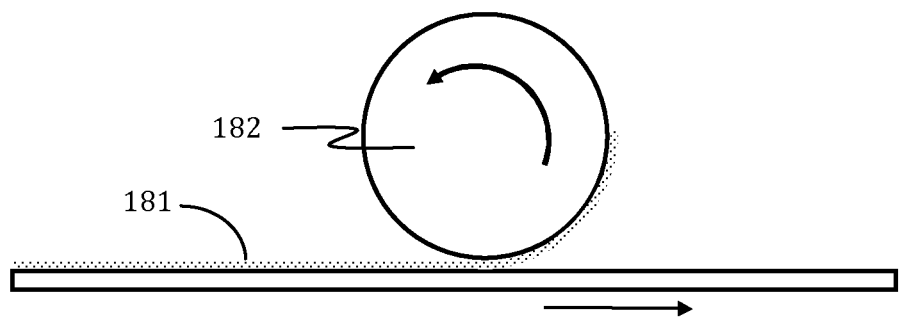
FIGS. 18A-18D are a sequence of schematic diagrams illustrating fabrication of a nanopatterned cylinder mask with a dual layer polymer in accordance with another embodiment of the present invention.
Figure 18B:
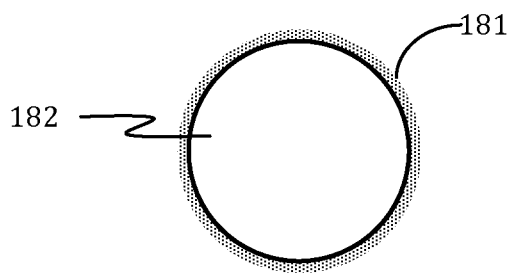
Figure 18C:
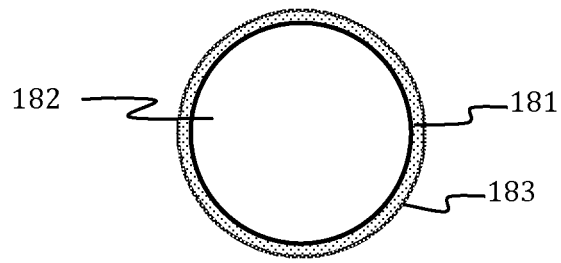
Figure 18D:
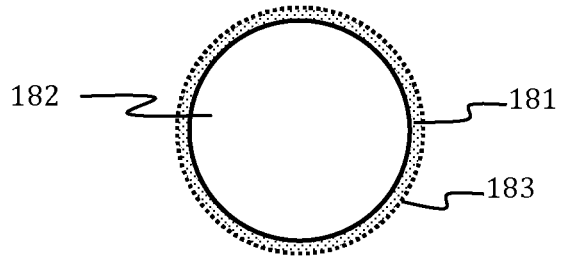

In another embodiment, shown in FIG. 18A, a first (cushion) layer 181 can be instead formed as a solid layer and laminated to the surface of the cylinder 182. A thinner, stiffer second layer 183 could then be deposited on top of the first layer 181, as shown in FIG. 18B, and then patterned using methods described herein. In other implementations, the first layer may be deposited onto the surface of the cylinder and then partially or fully cured, and then thinner, stiffer second layer 183 can be first patterned and then laminated on top of the first layer 181, as shown in FIGS. 18C-18D.

It is noted that in certain embodiments of the present invention described above a large area master may be used to either for direct patterning of the cylinder or to pattern a polymer layer that is subsequently laminated to the cylinder. There are a number of different methods to form such a large area master, which may be divided into two major groups. The first major group may be categorized as flat film patterning with subsequent lamination. The second major group may be categorized as direct cylinder patterning.

In flat film patterning, the polymer film may be patterned while flat and then attached to the surface of the cylinder. There are a number of different possible approaches to patterning the film while flat.

In a first example, a small master may be fabricated, e.g., using electron beam (E-beam), deep ultraviolet (DUV), or holographic lithography, etc to etch the nanopattern into silicon (Si) or glass. The small master may be a few millimeters to a few centimeters in dimension. The pattern on the small master may be transferred onto one or many submasters (e.g., polymer material, like Polyurethane, Epoxy, SSQ, MRI, etc.) Then the submaster can be used as a mold to imprint the pattern onto a large sheet of polymer material to be laminated onto a cylinder. The patterning of the submaster(s) can be done by stamp-and-step method with high accuracy of translation in two dimensions to provide minimum gap between fields. The stamp size (i.e., the size of the master) could be chosen to be slightly larger than a step between fields, so a very small overlap in patterns would provide a continuous gap-free pattern of the large area mold. Gaps between the fields could be filled and patterned as explained above.

Another alternative is to use interference lithography to pattern a large area substrate surface, which is subsequently used to generate a secondary replica in polymer. The resulting patterned polymer can then be laminated onto the cylinder surface.

Figures 19A, 19B:
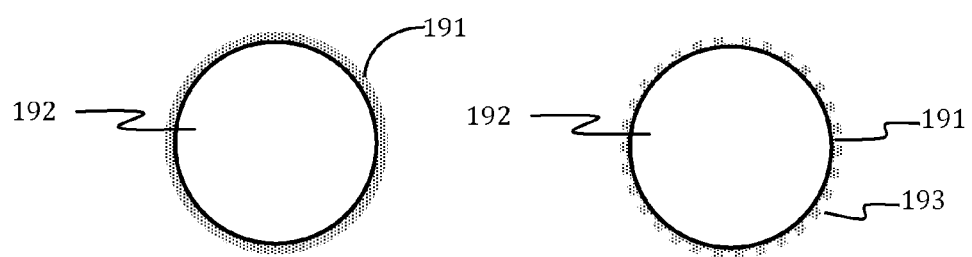
FIGS. 19A-19E are a sequence of schematic diagrams illustrating fabrication of a nanopatterned cylinder mask using direct "cylinder-to-cylinder" nanoimprint pattern transfer.
Figures 19C, 19D:
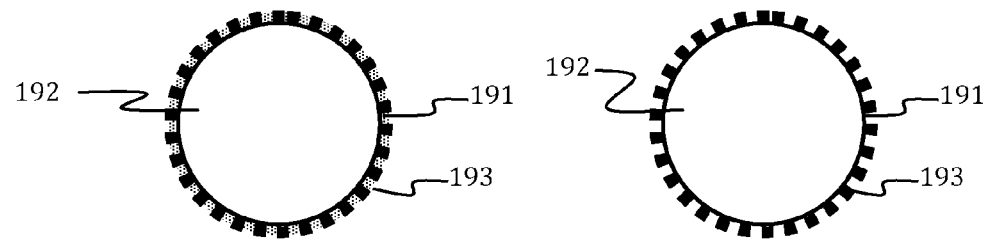
Figure 19E:
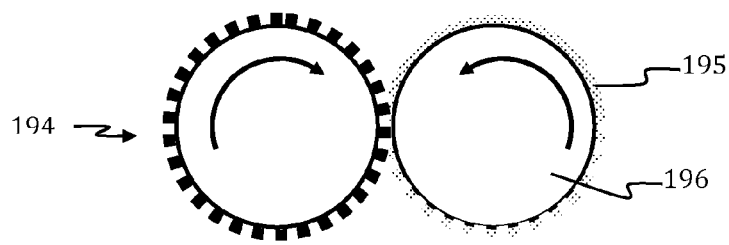

A number of different techniques may be envisioned for direct cylinder patterning. For example, as shown in FIG. 19A, interference lithography (either scanning or step-and-repeat) may be performed on a photoresist 191 coated on a cylinder 192. The resist 192 may be developed, as shown in FIG. 19B, and the resulting pattern may be plated onto the cylinder, e.g., by plating a material 193 (e.g., a metal) onto the cylinder through openings in the pattern in the developed resist 191, as shown in FIG. 19C. After the resist 191 is removed, as shown in FIG. 19D, the plated material remains and the resulting nanostructured cylinder 194 may subsequently be used for "cylinder-to-cylinder" nanoimprint pattern transfer to a material 195 (e.g., a partially cured polymer or another resist on a second cylinder 196, as shown in FIG. 19E.

In some embodiments laser ablation (e.g., 2, or 3-photon etching) of polymer material deposited on cylinder surface may be used as an alternative to interference lithography to fabricate a mask or a master for "cylinder-to-cylinder" nanoimprint pattern transfer. In 2, or 3-photon etching, two or more laser beams intersect at a point on the cylinder surface. At the point where the laser beams intersect a two-photon or three-photon process takes place that causes an interaction that locally removes material from the cylinder surface.

In other embodiments a master cylinder coated with nanostructured alumina may be used to transfer a nanopattern onto a polymer-coated mask using "cylinder-to-cylinder" nanoimprint lithography Nanoporous alumina can be formed with a nanoporous structure having desired pore size and pore density without use of a mask or lithography.

Figure 20A:
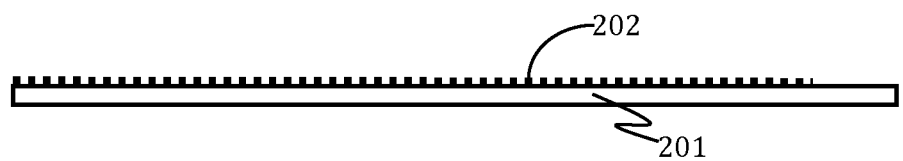
FIGS. 20A-20B are a sequence of schematic diagrams illustrating fabrication of a nanopatterned cylinder mask using direct nanoimprinting of a polymer precursor on a surface of a transparent cylinder.
Figure 20B:
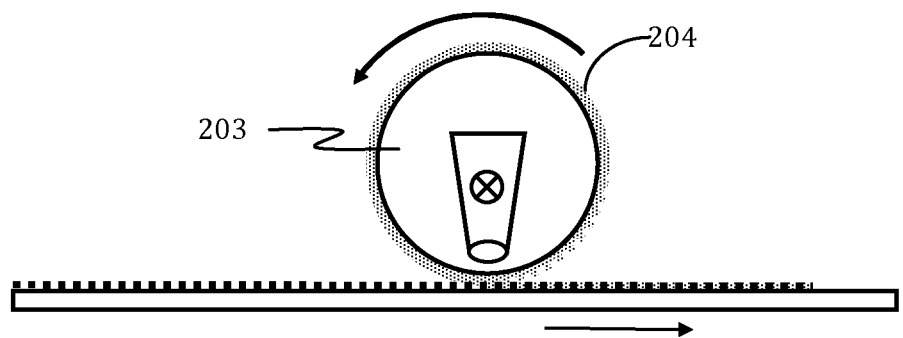

FIGS. 20A-20B illustrate yet another approach to cylinder mask fabrication. First, a flat substrate 201 (e.g., glass, silicon, metal or polymer) may be patterned using step-and repeat nanoimprinting or interference lithography, or anodic alumina porous surface fabrication, or self-assembly of spheres or nanoparticles with subsequent etch, or other known nanolithography techniques to create a desired surface relief with specific nanostructured pattern 202, as shown in FIG. 20A.

Then, as shown in FIG. 20B, a quartz cylinder 203 coated with a UV-curable liquid polymer precursor material 204 may be brought into contact with the patterned surface 202, which makes liquid polymer precursor flow into the surface relief structures of the patterned surface 202. A UV light source 205 beams UV-light onto the area of contact between the surface of the cylinder 203 and the polymer precursor material 204. The UV-light cures the polymer material 204 freezing a pattern of cured polymer from the patterned surface 202 onto the surface of the cylinder 203. This imprinting happens during substrate translation, which makes cylinder 203 rotate due to frictional forces between the polymer material 204 on the cylinder and the substrate 201. The UV-light source 205 may be located inside the cylinder 203. Alternatively, the UV-light source 205 may be located outside of the cylinder 203, and the UV light may be beamed inside and onto the area of contact between the surface of the cylinder 203 and the polymer precursor material 204.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A method for forming a nanopatterned cylindrical photomask, comprising:
   forming a master pattern on a master substrate, wherein the master pattern includes nanometer scale features;
   forming a layer of an elastomer material on a surface of a transparent cylinder;
   transferring the master pattern from the master to the layer of elastomer material on the surface of the cylinder.

2. The method of claim 1, wherein the master substrate is a flat rigid substrate.

3. The method of claim 1, wherein the master substrate is made of a flexible material.

4. The method of claim 1 wherein transferring the master pattern from the master to the layer of elastomer material on the surface of the cylinder includes "plate-to-cylinder" nanoimprint lithography, optical lithography in a standard contact or near-field configurations, bond detach or decal transfer lithography, micro-contact printing, nanotransfer printing, and scanning beam interference lithography.

5. The method of claim 1, wherein transferring the master pattern from the master to the layer of elastomer material on the surface of the cylinder includes continuously rotating the cylinder during a lithography process that uses the master as a lithography mask.

6. The method of claim 1, wherein transferring the master pattern from the master to the layer of elastomer material on the surface of the cylinder includes or "step-and-rotate" mode in which lithography is done one section of cylinder at a time with a subsequent rotational step between lithographic processes.

7. The method of claim 1, wherein transferring the master pattern from the master to the layer of elastomer material on the surface of the cylinder includes a nanoimprint lithography technique in a "plate-to-cylinder" configuration.

8. The method of claim 7 wherein the nanoimprint lithography technique includes contacting the cylinder with a nanostructured substrate master having a relief profile to imprint the relief profile into the elastomer material on the surface of the cylinder.

9. The method of claim 8, further comprising curing an imprinted part of the elastomer material on the surface of the cylinder.

10. The method of claim 1, wherein transferring the master pattern from the master to the layer of elastomer material on the surface of the cylinder includes using contact optical lithography.

11. The method of claim 1, wherein transferring the master pattern from the master to the layer of elastomer material on the surface of the cylinder includes using a bond-detach lithography technique.

12. The method of claim 11, wherein the bond-detach lithography technique includes forming the master pattern in a metal layer on a substrate having an oxide layer deposited or grown on it, activating the elastomer and the oxide layer by exposure to plasma, UV, ozone, or corona discharge, contacting exposed portions of the activated oxide layer and activated elastomer such that they bond together while metal coated portions of the oxide layer do not, and rotating the cylinder to pull bonded portions of the elastomer from the cylinder.

13. A method for forming a nanopatterned cylindrical photomask, comprising:
   forming a pattern on an elastomer substrate, wherein the pattern includes nanometer scale features;
   laminating the patterned elastomer substrate to a surface of a cylinder.

14. The method of claim 13, wherein the nanopatterned elastomer is made slightly longer than a circumference of the cylinder so that the film slightly overlaps itself at its ends when attached to the cylinder.

15. The method of claim 13, further comprising filling a seam between ends of the elastomer film on the cylinder with the pattern.

16. The method of claim 13, wherein the elastomer film is coated with a thin metallic coating and the nanostructure pattern is formed in the metallic coating, wherein the elastomer is attached to the cylinder such that the elastomer is between the cylinder and the nanostructure pattern formed in the metallic coating, whereby the photomask is a plasmonic mask.

17. The method of claim 13, wherein the elastomer film includes two or more layers.

18. The method of claim 17, wherein the two or more layers include a relatively thick and soft first layer and a relatively thin and stiff second layer, wherein the first layer is between the first and second layers are laminated to the surface of the cylinder such that the first layer is between the surface of the cylinder and the second layer, wherein the nanostructure pattern is formed in the second layer.

19. The method of claim 13, wherein forming the pattern on the elastomer substrate includes forming a small master having a pattern corresponding to a portion of the pattern to be formed on the elastomer substrate, transferring the pattern on the small onto one or more submasters, using the submaster as a mold to imprint the pattern onto the elastomer substrate.

20. The method of claim 19, wherein patterning the submaster(s) is done by stamp-and-step method.

21. The method of claim 20, wherein a size of the submaster is chosen to be slightly larger than a step between fields, so that a small overlap in patterns provides a continuous gap-free pattern on the elastomer substrate.

22. The method of claim 13, wherein forming the pattern on the elastomer substrate includes using interference lithography to pattern an elastomer sheet and generating a secondary replica the material used to form the elastomer substrate.

* * * * *